United States Patent
Kosonocky et al.

(10) Patent No.: US 10,120,430 B2
(45) Date of Patent: Nov. 6, 2018

(54) DYNAMIC RELIABILITY QUALITY MONITORING

(71) Applicants: Advanced Micro Devices, Inc., Sunnyvale, CA (US); ATI Technologies ULC, Markham (CA)

(72) Inventors: Stephen V. Kosonocky, Ft. Collins, CO (US); Thomas Burd, Fremont, CA (US); Adam Clark, Victoria (CA); Larry D. Hewitt, Austin, TX (US); John Vincent Faricelli, Stow, MA (US); John P. Petry, San Diego, CA (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 93 days.

(21) Appl. No.: 15/258,816

(22) Filed: Sep. 7, 2016

(65) Prior Publication Data

US 2018/0067535 A1     Mar. 8, 2018

(51) Int. Cl.
| | |
|---|---|
| G06F 1/32 | (2006.01) |
| G01R 31/28 | (2006.01) |
| G06F 11/00 | (2006.01) |
| G06F 11/34 | (2006.01) |

(52) U.S. Cl.
CPC ....... *G06F 1/3209* (2013.01); *G01R 31/2856* (2013.01); *G01R 31/2874* (2013.01); *G06F 1/3206* (2013.01); *G06F 1/3234* (2013.01); *G06F 11/008* (2013.01); *G06F 11/3409* (2013.01)

(58) Field of Classification Search
CPC ............ G01R 31/2849; G01R 31/2882; G01R 31/308; G01R 31/31725; G06F 11/24; G06F 17/5081; H01L 22/12; H01L 22/20; H01L 22/34
See application file for complete search history.

(56) References Cited

U.S. PATENT DOCUMENTS

| | | |
|---|---|---|
| 6,418,459 B1 | 7/2002 | Gulick |
| 6,760,852 B1 | 7/2004 | Gulick |
| 6,826,704 B1 | 11/2004 | Pickett |

(Continued)

OTHER PUBLICATIONS

European Search Report in European Application No. 16203675.0, dated Jun. 21, 2017, 4 pages.

(Continued)

*Primary Examiner* — Zahid Choudhury
(74) *Attorney, Agent, or Firm* — Meyertons Hood Kivlin Kowert and Goetzel PC; Rory D. Rankin

(57) ABSTRACT

A system and method for managing operating modes within a semiconductor chip for optimal power and performance while meeting a reliability target are described. A semiconductor chip includes a functional unit and a corresponding reliability monitor. The functional unit provides actual usage values to the reliability monitor. The reliability monitor determines expected usage values based on a reliability target and the age of the semiconductor chip. The reliability monitor compares the actual usage values and the expected usage values. The result of this comparison is used to increase or decrease current operational parameters.

24 Claims, 5 Drawing Sheets

(56) References Cited

U.S. PATENT DOCUMENTS

| | | | |
|---|---|---|---|
| 2007/0208538 A1* | 9/2007 | Gross | G06F 11/24 |
| | | | 702/182 |
| 2011/0265090 A1* | 10/2011 | Moyer | G06F 1/3203 |
| | | | 718/103 |
| 2012/0007663 A1* | 1/2012 | Ricca | G05F 1/465 |
| | | | 327/538 |
| 2013/0326269 A1* | 12/2013 | Losh | G06F 11/2053 |
| | | | 714/6.13 |
| 2013/0346774 A1* | 12/2013 | Bhandaru | G06F 1/3234 |
| | | | 713/320 |
| 2014/0068298 A1* | 3/2014 | Simeral | G06F 11/3409 |
| | | | 713/322 |
| 2014/0306837 A1 | 10/2014 | Hauck, III | |
| 2014/0375658 A1 | 12/2014 | Lichmanov et al. | |
| 2015/0377955 A1 | 12/2015 | Shapira et al. | |
| 2016/0378168 A1 | 12/2016 | Branover et al. | |

OTHER PUBLICATIONS

Communication pursuant to Article 94(3) in European Application No. 16203675.0, dated Aug. 8, 2017, 7 pages.
Majumdar, et al., U.S. Appl. No. 15/192,784, entitled "Temperature-Aware Task Scheduling and Proactive Power Management", filed Jun. 24, 2016, 35 pages.
Communication pursuant to Article 94(3) in European Application No. 16203675.0, dated Feb. 16, 2018, 9 pages.

* cited by examiner

DYNAMIC RELIABILITY QUALITY MONITORING

BACKGROUND

Description of the Relevant Art

The power consumption of modern integrated circuits (IC's) has become an increasingly important design issue with each generation of semiconductor chips. Integrated circuit power dissipation constraints are not only an issue for portable computers and mobile communication devices, but also for high-performance microprocessors which may include multiple processor cores and multiple pipelines within a core.

Power management units (PMU) for an IC may reduce power to a portion of the IC when it detects, or is otherwise informed, that the portion is unused for a given period of time. Similarly, power-performance states (P-states) or dynamic voltage and frequency scaling (DVFS) techniques are adjusted based on usage feedback of one or more processing units. Typically, power management algorithms assume worst-case thermal conditions and anticipated usage of an IC over time when estimating a lifetime for the IC. Given these assumptions, lower performance states (on average) are selected than might otherwise have been chosen. However, during typical usage the worst-case thermal conditions may not actually be met. Consequently, the power constraints placed upon the system due to the worst-case assumptions may be more stringent than necessary. Unfortunately, as the use of the IC is predicted in advance and built into the system, the system may provide lower performance during its anticipated life than could have otherwise been achieved.

In view of the above, efficient methods and systems for managing operating modes within a semiconductor chip for optimal power and performance while meeting a reliability target are desired.

Figure 1:
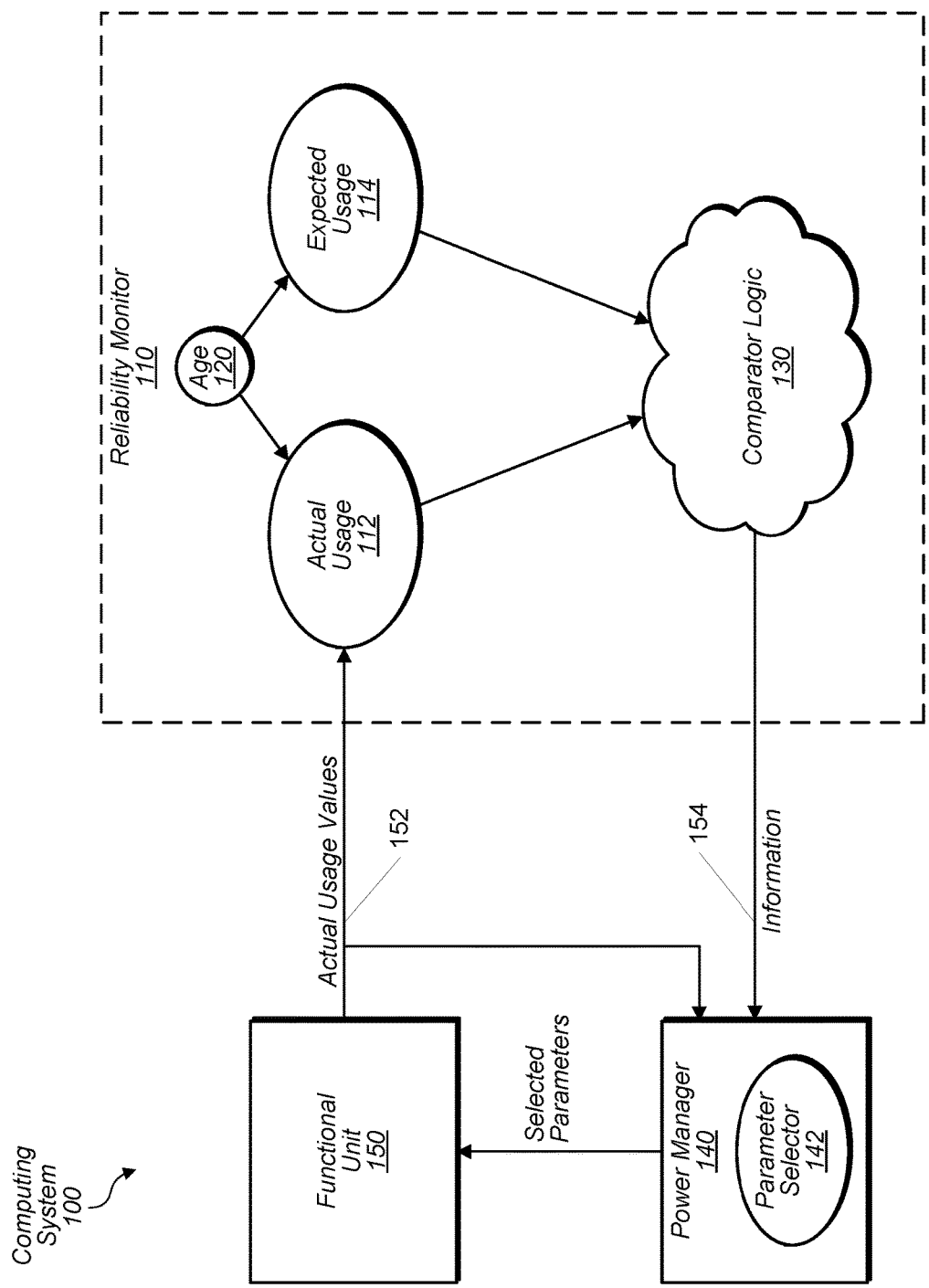
FIG. 1 is a generalized diagram of one embodiment of a computing system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for managing operating parameters within a semiconductor chip for optimal power and performance while meeting a reliability target are contemplated. In various embodiments, a semiconductor chip includes one or more functional units each of which operates with respective operating parameters. One or more functional units are connected to a corresponding reliability monitor. These one or more functional units report actual usage values to a reliability monitor. For example, the one or more functional units report the actual usage values each time a given time interval elapses. The actual usage values for the functional unit are based at least upon one or more operating parameters and an age of the functional unit. In some embodiments, the operational parameters include power performance states (P-states) for a given functional unit, dynamic voltage and frequency scaling (DVFS) parameters for multiple functional units, activity levels, the values of such parameters during given time intervals, the average of such parameters over given time intervals, and so forth. The actual usage values can also include an operational temperature.

A reliability monitor receives the actual usage values from a functional unit and determines expected usage values for the corresponding functional unit based at least in part on the age of the functional unit. For example, if the reliability target of a semiconductor chip is a lifespan of at least five years, then expected usage values over a selected duration are set based on the reliability target of the five year lifespan. The selected duration can be hourly, daily, weekly, or otherwise. The distribution of the expected usage values can be set as desired. For example, in one embodiment, a uniform distribution is used where an approximately equal expected usage value is used for each time interval during the lifetime of the chip. In other embodiments, higher expected usage values are set for earlier stages of the lifespan while lower expected usage values are set for later stages of the lifespan, or vice-versa. Other distributions for setting the expected usage values based on the reliability target are possible and contemplated.

The reliability monitor compares the received actual usage values to the expected usage values. In various embodiments, the reliability monitor maintains a reliability metric as an accumulated value over time based at least upon the received actual usage values from the functional unit and the age of the functional unit. When the reliability monitor determines the received actual usage values exceed the expected usage values, the reliability monitor generates information (e.g., a command or otherwise) to increase reliability for the functional unit by decreasing power consumption and/or other operating parameters. When the reliability monitor determines the received actual usage values exceed the expected usage values, the remaining anticipated lifetime of the functional unit may not reach the target lifetime. By reducing the operational parameter the remaining lifetime may be extended so that the target lifetime is reached. In contrast, the reliability monitor generates a command to permit a boost in performance of the functional unit responsive to determining the received actual usage values are less than the expected usage values. In this manner, the reliability monitor replaces or modifies an anticipated use approach by using feedback under real usage conditions. When actual usage is less than originally anticipate usage, the adjustments provided by the reliability monitor increase performance of the chip while still reaching the target lifetime of the functional unit.

Turning to FIG. 1, a generalized block diagram of one embodiment of a computing system 100 is shown. As shown, the computing system 100 includes a functional unit 150, a reliability monitor 110 and a power manager 140. The functional unit 150 can also be representative of any circuitry with its own voltage/clock domain. The functional unit 150 conveys actual usage values 152 to each of the reliability monitor 110 and the power manager 140. Control logic, such as the parameter selector 142, within the power manager 140 uses the received actual usage values to select one or more operational parameters for the functional unit 150. Additionally, the parameter selector 142 receives and use information from the reliability monitor 110 to update operational parameters for the functional unit 150. The information includes one or more commands, indications, flags, or computed values used to adjust the operational parameters. For example, without the information from the reliability monitor 110, the parameter selector 142 selects different parameters based on worst-case maximum limits for power consumption. In some embodiments, one or more algorithms used by the parameter selector 142 use a thermal design power (TDP) value. The TDP value represents an amount of power that a cooling system is able to dissipate without exceeding the maximum junction temperature for transistors within the chip.

The reliability monitor 110 also receives the actual usage values from the functional unit 150. The reliability monitor also stores expected usage values 114. One or more of the actual usage values 112 and the expected usage values 114 depends on an age 120 of the functional unit 150. The comparator 130 within the reliability monitor 110 compares the actual usage values 112 and the expected usage values 114. The comparison performed by the comparator 130 determines whether the usage of the functional unit 150 is on target with a reliability target. For example, if a reliability target for the computing system 100 is a lifespan of at least five years, then multiple expected usage values over a duration is set based on the reliability target of the five year lifespan.

Control logic within the reliability monitor 110 receives the comparison result from the comparator 130 and determine the received actual usage values 112 exceed the expected usage values 114. In response, the control logic within the reliability monitor 110 provides information 154 to direct the power manager 140 to increase reliability for the functional unit 150. In such a case, the information 154 may indicate one or more of the operating parameters should be reduced. In on embodiment, reduced maximum values for operating parameters are indicated. The reduced maximum values used by the parameter selector 142 causes the parameter selector 142 to select parameters which reduce power consumption by the functional unit 150. The reduced maximum values and the resulting selected operating parameters sent to the functional unit 150 reduce wear on the functional unit 150, and thus increase reliability of the functional unit 150.

In contrast to the above, when the comparison result from the comparator 130 indicates the received actual usage values 112 are less than the expected usage values 114, the reliability monitor 110 provides information for use by the power manager 140 indicating a performance boost is available. The information sent from the reliability monitor 110 to the power manager 140 indicates maintaining or increasing maximum values for one or more of the operating parameters. The updated maximum values used by the parameter selector 142 causes the parameter selector 142 to select parameters which increase performance for the functional unit 150. In some embodiments, the functional unit 150 is representative of a processing unit, a general-purpose central processing unit (CPU) complex, a graphics processing unit (GPU), or another processor such as a digital signal processing (DSP) cores, a field programmable gate arrays (FPGA), an application specific integrated circuits (ASIC), and so forth. As described earlier, the functional unit 150 is representative of any circuitry with its own voltage/clock domain. For example, the functional unit 150 can be a memory controller, an input/output (I/O) hub controller, or other. A description of other embodiments with multiple voltage/clock domains is provided later. A single voltage/clock domain is discussed here for ease of illustration. In some embodiments, a reliability monitor 110 is used for a given voltage/clock domain. In other embodiments, a reliability monitor 110 is used for multiple voltage/clock domains.

The functional unit 150 provides actual usage values to the power manager 140 and the reliability monitor 110. The actual usage values for the functional unit 150 are based upon one or more operating parameters, an operational temperature, an operational current, and an age of the functional unit 150. In various embodiments, the functional unit 150 utilizes analog or digital thermal sensors to provide information as to when the die heats up in a particular area due to increased compute activity.

The reliability of the functional unit 150 can be critical and the actual usage values are used to monitor, track and adjust the usage of the functional unit 150 to satisfy reliability targets. For example, the computing system 100 can be used in medical equipment, automotive systems such as anti-lock braking systems, banking and business-critical storage and processing systems, space travel systems and so forth. Due to the difficulty of testing under real conditions, equations anticipating the use and worst-case conditions were used to predict the life span of integrated circuits (ICs). For example, the ICs in the functional unit 150 may have gone through high temperature operating life testing and the expected life span under real conditions was extrapolated from data gathered during the testing. However, the reliability monitor 110 replaces the anticipated use approach and provides real-time feedback under real usage conditions to monitor and adjust usage to satisfy a reliability target and take advantage of available performance.

The operational temperature over time indicates wear on the functional unit 150. The on-die sensors in the functional unit 150 provide one or more operational temperature values to both the power manager 140 and the reliability monitor 110. The one or more operational temperature values over time indicates whether particular types of circuit failures are more or less likely. For example, time-dependent dielectric breakdown (TDDB) occurs when the gate oxide breaks down as a result of long-time application of a relatively low electric field being applied over a long duration. The breakdown is caused by formation of electron tunneling current forms a conducting path through the gate oxide to the substrate. Typically, the metal oxide semiconductor (MOS) field effect transistor (FET) is operating near or beyond its specified operating voltage.

Another type of circuit failure occurs when electromigration gradually moves ions in a conductor during applications of high current densities. For example, copper or other traces used as long conducting wires for an appreciable amount of time experience diffusing metal atoms. As transistor widths and trace widths decrease, the effects of electromigration increase.

In addition to operational temperature values, the actual usage values sent from the functional unit 150 to the reliability monitor 110 includes an operational voltage, an operational current, and a clock frequency. The combination of these values is used in power performance states (P-states). The power manager 140 provides P-state information to the functional unit 150. In some embodiments, the functional unit 150 uses only the operational voltage and clock frequency associated with the received P-state. In other embodiments, the functional unit 150 includes internal power management techniques. For example, the operating system or application-specific processes uses dynamic voltage and frequency scaling (DVFS) techniques. Downloaded drivers uses tables supplied by basic input output software (BIOS) to obtain clock frequency, operational voltage, temperature, and current information appropriate for a particular platform. Frequency and voltage transitions can be unavailable if the BIOS does not supply these tables.

In addition to the DVFS scaling techniques, the microarchitecture and circuit-level design techniques for balancing power consumption and performance of the functional unit 150 can be aided by efforts to estimate in real-time the power consumption of circuitry and functional blocks within the functional unit 150. Methods for estimating this power consumption in real-time includes measuring an activity level of the circuitry and functional blocks. Any of a variety of techniques can be utilized to determine power consumption of circuitry and functional blocks within the functional unit 150.

In some embodiments, the functional unit 150 samples a number of pre-selected signals. The selection of which signals to sample during a particular clock cycle corresponds to how well the selection correlates to the amount of switching node capacitance within the functional unit 150. For example, in some embodiments, various clock enable signals, bus driver enables, mismatch lines in content-addressable memories (CAM), and CAM word-line (WL) drivers can be chosen for sampling. A corresponding weight can be selected for each of the sampled signals. Multiple samples can be taken during a sample interval. A count can be maintained for such signals during operation. Based on these counts, an estimate of power consumption corresponding to the counts is determined. The estimated power consumption from the sampled signals would not be based on measures of thermal conditions or current draw. In addition to or in place of the sampled signals, one or more current draw measurements from on-die current sensors is sent in the actual usage values from the functional unit 150 to the power manager 140 and the reliability monitor 110.

In some embodiments, the reliability monitor 110 stores the received actual usage values and later processes them. In other embodiments, the reliability monitor 110 pre-processes the received actual usage values to combine them with one another, combine them with other values stored within the reliability monitor 110, index one or more tables to access other values, and so forth. The actual usage values 112 represent values used by control logic within the reliability monitor 110 following one or more pre-processing steps or no pre-processing steps.

The expected usage values correspond on an age 120 of the functional unit 150. In some embodiments, the functional unit 150 provides an indication of age with the actual usage values to the reliability monitor 110. In other embodiments, the reliability monitor 110 maintains the age 120. In some embodiments, the reliability monitor 110 uses a timestamp value to maintain the age. In other embodiments, the reliability monitor 110 uses one or more counters to maintain the age. One counter can be incremented hourly and roll over at the end of a 24 hour period, whereas other counters are incremented daily, weekly, monthly and annually. In such a case, the concatenation of the counter values provides an age of the functional unit 150. In other embodiments, software, such as the operating system, maintains the age of the functional unit 150.

The reliability monitor 110 determines the expected usage values 114 for the functional unit 150 based on the age 120 and a reliability target. For example, if a reliability target for the functional unit 150 is a lifespan of at least five years, then multiple expected usage values 114 over a duration is set based on the reliability target being the five year lifespan. For example, expected usage values 114 may be set for each day of a five year period. Alternatively, other embodiments can set expected usage values 114 for different time intervals, such as hourly, weekly, monthly, each quarter of a year, and so forth.

In addition to the above, the distribution of the expected usage values 114 is set as desired. For example, a uniform distribution can be used where a same expected usage value 114 is used for each time interval. Higher expected usage values are set for earlier stages of the lifespan while lower expected usage values are set for later stages of the lifespan. Other distributions for setting the expected usage values 114 based on the reliability target are possible and contemplated. In addition, each of the reliability target, the time intervals, and the distribution can be programmable values stored in control and configuration registers.

In various embodiments, the reliability monitor 110 combines the actual usage values 112 to generate a single reliability metric. The reliability monitor 110 can maintain the reliability metric as an accumulated value over time based at least upon the actual usage values 112 and the age 120 of the functional unit. Similarly, the expected usage values 114 can be combined to generate a single target metric. The comparator 130 compares the reliability metric generated from the actual usage values 112 and the target metric generated from the expected usage values 114. The comparison result indicates whether the functional unit 150 is overused, underused or on target as compared to an expected usage based on the reliability target.

When the comparator 130 determines the actual usage values 112 exceed the expected usage values 114, the comparator 130 generates information (or an indication) to increase reliability for the functional unit 150. As described earlier, the information includes one or more of commands, indications or flags, computed values, and/or otherwise that are used to adjust operational parameters for the functional unit 150. The information indicates updating maximum values for one or more of the operating parameters to values less than current maximum values for the one or more operating parameters.

As an example, during the initial 6 months of usage, a computing system 100 may experience a relatively high workload that exceeds what was expected. Therefore, during a time interval, such as the next 6 months, the reliability monitor 110 generates information that causes a reduction in the maximum values (and power consumption) in order to increase reliability of the functional unit 150. The information corresponds to upcoming expected actual usage values for the next 6 months based on a given distribution of usage as described earlier.

In some embodiments, the reliability monitor 110 provides the information to the power manager 140. In other embodiments, the reliability monitor 110 provides the information to both the power manager 140 and the functional unit 150. The power manager 140 updates the operational parameters to send to the functional unit 150 based on actual usage values received from the functional unit 150 and the information received from the reliability monitor 110.

In contrast to the above, when the comparator 130 determines the actual usage values 112 are less than the expected usage values 114, the comparator 130 generates information to boost performance for the functional unit 150. The information indicates updating maximum values for one or more of the operating parameters to values greater than current maximum values for the one or more operating parameters. For example, after the initial 6 months of usage, the computing system 100 may have been utilized less than expected. Therefore, the reliability monitor 110 generates information to increase maximum values for one or more operating parameters in order to allow a boost in performance.

The power manager 140 includes circuitry and logic for processing power management policies for the functional unit 150. The power manager 140 disables, or otherwise reduces power consumption, of portions of the functional unit 150 when it detects or is otherwise informed that the portion is unused for a given period of time. Similarly, power-performance states (P-states) or dynamic voltage and frequency scaling (DVFS) techniques can be adjusted based on usage feedback from the functional unit 150. The initial algorithms for managing power assume worst-case thermal conditions. However, the actual usage and environmental conditions will likely be less than the worst-case. Therefore, rather than use lower performance states, the information from the reliability monitor 110 aids the parameter selector 142 in selecting higher performance states when possible (e.g., when usage has been lower than expected) and lower performance states when appropriate (e.g., when usage has been higher than expected).

Figure 2:
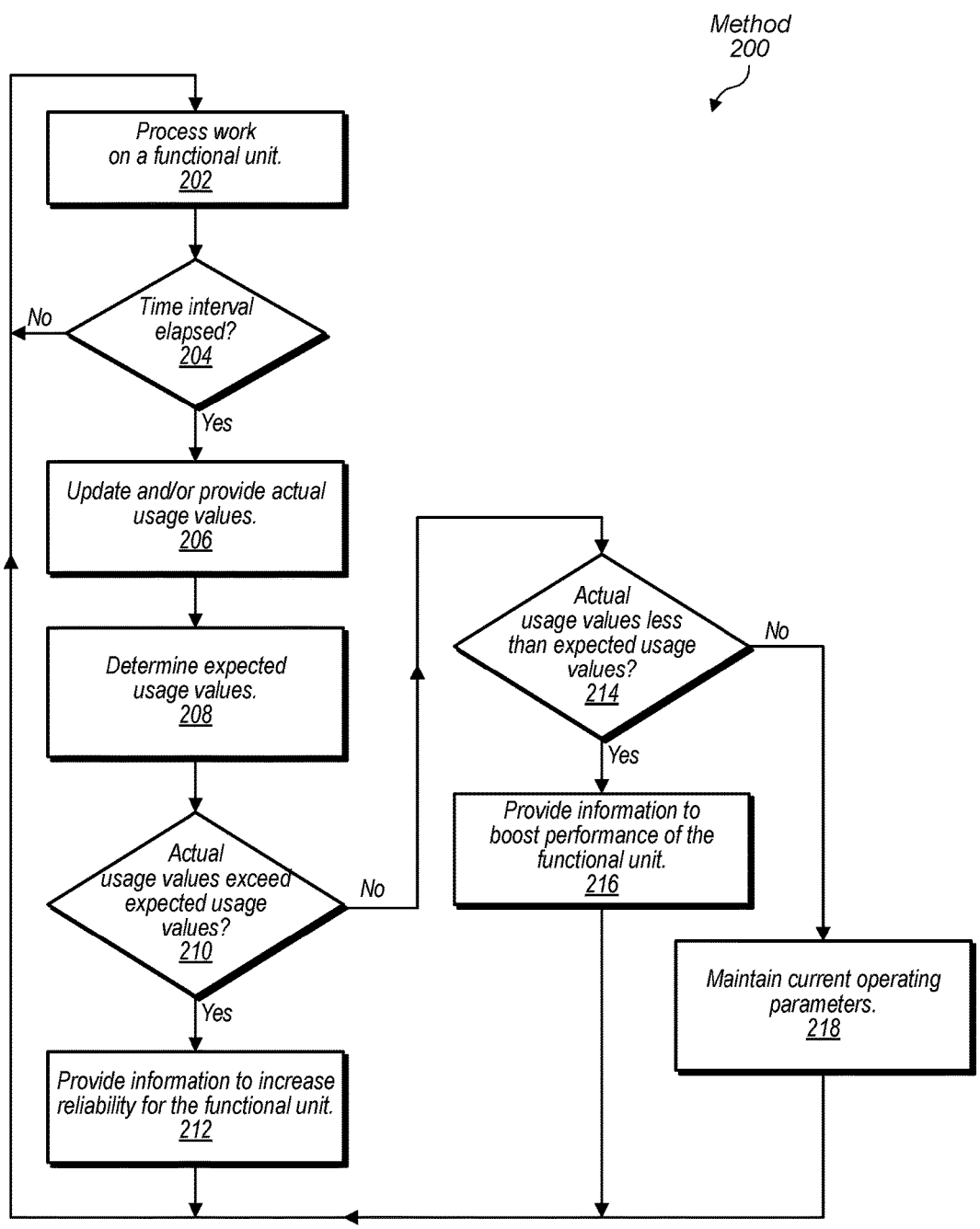
FIG. 2 is a generalized diagram of one embodiment of a method used for increasing performance and reliability of a computing system.

Referring now to FIG. 2, one embodiment of a method 200 for increasing performance and reliability of a computing system is shown. For purposes of discussion, the steps in this embodiment (as well as in FIGS. 3 and 5) are shown in sequential order. However, in other embodiments some steps occur in a different order than shown, some steps are performed concurrently, some steps are combined with other steps, and some steps are absent.

In block 202, a workload is processed by a functional unit. Such a workload generally entails execution of software applications, operating system processes, or other processes. When a given time interval has elapsed (conditional block 204), then in block 206, the functional unit provides actual usage values or makes such usage values available for access. In some embodiments, in addition to the elapse of a time interval, such usage values may be provided at other times. For example, responsive to a user command, program code, or the detection of some event. In one embodiment, the functional unit provides the actual usage values to a reliability monitor. The functional unit additionally provides the actual usage values for use by a power manager. The actual usage values includes one or more of an operational temperature, a current draw, power performance state (P-state) information, dynamic voltage and frequency scaling (DVFS) parameters, activity levels and other power consumption values. In some embodiments, the actual usage values also use corresponding weights. Alternatively, weights can be associated when the actual usage values are received at the reliability monitor. An age can also be associated with the actual usage values through one or more accumulated sums.

In block 208, expected usage values based on the age of the functional unit are determined. The determination uses the age of the functional unit and a distribution of expected usage values based on a reliability target as described earlier. In various embodiments, the received actual usage values are combined to generate a single reliability metric. The reliability metric can be maintained as an accumulated value over time based at least upon the actual usage values and the age of the functional unit. Similarly, the expected usage values can be combined to generate a single target metric. The reliability metric generated from the actual usage values are compared to the target metric generated from the expected usage values. The comparison result indicates whether the functional unit has been used more than expected, less than expected, or approximately equal to what is expected based on the reliability target.

If the actual usage values exceed the expected usage values (conditional block 210), then in block 212 a command or other information is provided to the power manager to increase reliability for the functional unit. In some embodiments, providing the information includes storing the information in a location (e.g., a register or memory location) that is then accessed by the power manager. In other embodiments, the power manager may request such information from the monitor or other entity which then provides the requested information in response to the request. These and other embodiments are possible and are contemplated. The command or information indicates updating maximum values for one or more of the operating parameters to values less than current maximum values for the one or more operating parameters.

The command or information causes a reduction in power consumption by the function unit. In one embodiment, reducing power consumption includes reducing a maximum allowable power performance state, or a reduction in a maximum allowable average power performance state (P-state) over time, for the functional unit. In one embodiment, a "throttle" of a P-state includes decrementing a currently selected P-state by at least one P-state to a lower power consumption P-state. In some examples, the power manager does not select throttling the P-state if the power manager did not receive additional information from the reliability monitor. For example, the power consumption may not be relatively high, but the functional unit can be currently exceeding a reliability target. Factors such as at least the effects of TDDB, electromigration, and age can be used to determine the functional unit is currently exceeding the reliability target. Therefore, with the added information from the reliability monitor, the P-state is throttled.

If the actual usage values do not exceed the expected usage values (conditional block 210), but the actual usage values are less than the expected usage values (conditional block 214), then in block 216 a command or other information can be sent to the power manager that allows a boost in performance of the functional unit. In one embodiment, such a command or information indicates updating maximum values for one or more of the operating parameters to values greater than current maximum values for the one or more operating parameters. If the actual usage values do not exceed the expected usage values (conditional block 210), and the actual usage values are relatively equal to the expected usage values (conditional block 214), then in block 218 a command or other information is sent to the power manager to maintain operating parameters selected for the functional unit. Alternatively, no command or information is sent to the power manager. In such a case, the power manager simply maintains its current settings for the operating parameters.

As described earlier, the reliability monitor combines the received actual usage values to generate a single reliability metric. The reliability metric can be maintained as an accumulated value over time based at least upon the actual usage values and the age of the functional unit. By maintaining the reliability metric as an accumulated value, the reliability metric depends on an average of the received actual usage values over time. Similarly, the expected usage values can be combined to generate a single target metric. In some embodiments, the rate of the updates of the reliability metric and the target metric are programmable. For example, the reliability metric can be updated each millisecond, but other durations can be selected and later possibly changed. The target metric can be updated daily, but other durations can be selected and may later be changed.

Figure 3:
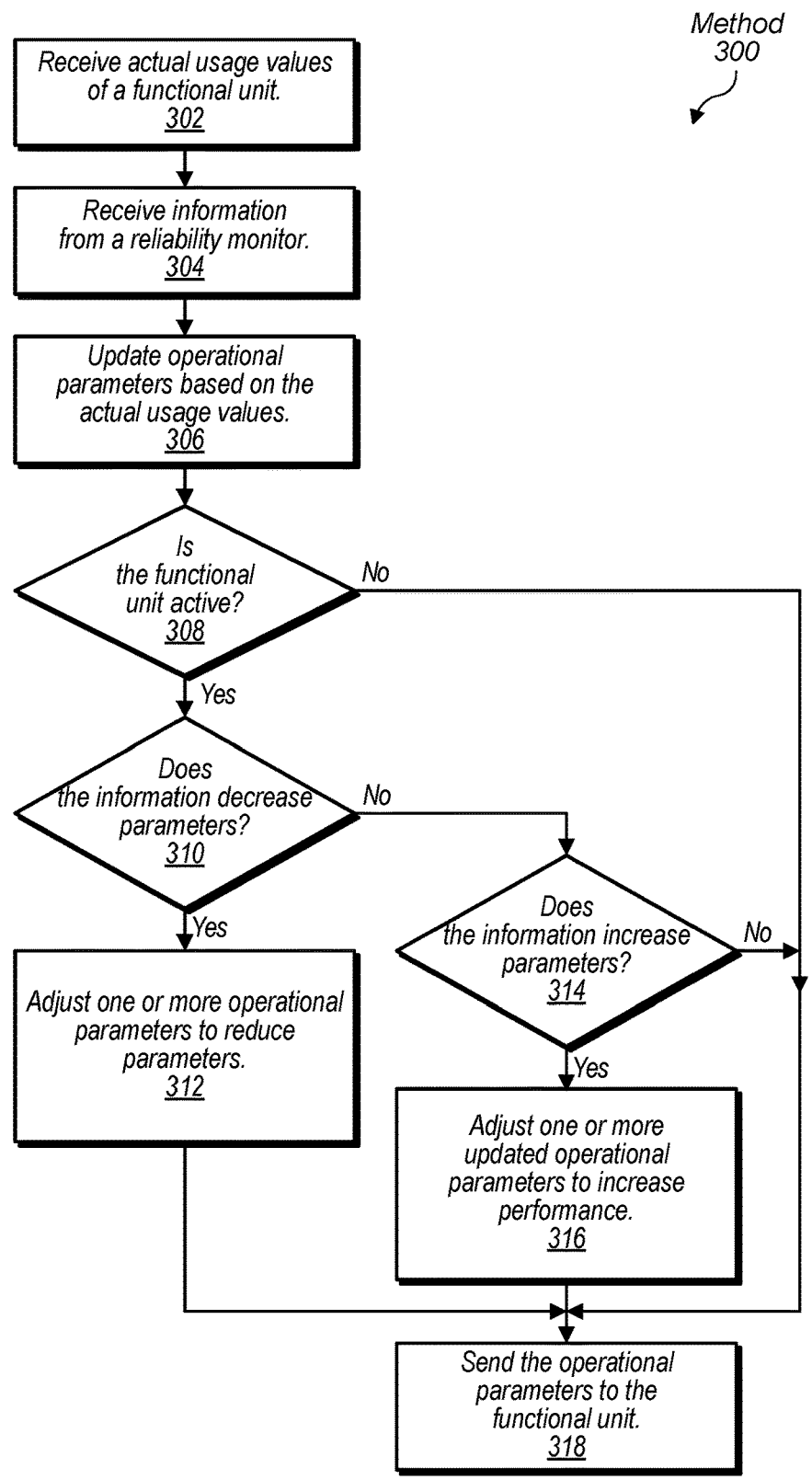
FIG. 3 is a generalized diagram of one embodiment of a method for adjusting operational parameters to increase reliability of a computing system.

Referring now to FIG. 3, one embodiment of a method 300 for adjusting operational parameters to increase reliability of a computing system is shown. In block 302, the actual usage values are received from a functional unit. As described earlier, examples of the actual usage values includes one or more of an operational temperature, a current draw, P-state information, DVFS parameters, activity levels and other power consumption values. Additionally, in block 304, a command or other information is received from a reliability monitor.

In block 306, at least one or more operational parameters can be updated based on the received actual usage values. For example, using the received actual usage values, the power manager or other logic determines to throttle or boost a P-state, reschedule high-performance software applications, enable or disable one or more functional blocks within the functional unit, and so forth.

If the functional unit is not active (conditional block 308), then in block 318, the operational parameters and any other directing information are sent to the functional unit. In some embodiments, a minimal activity level can be needed to be in use for the power manager to further consider feedback information from the reliability monitor. In some examples, the minimal activity level can be one or more activity levels above the lowest activity level associated with an inactive or turned off system.

If the functional unit is active (conditional block 308), and the received feedback from the reliability monitor, such as a command, indicates decreasing power consumption (conditional block 310), then in block 312 one or more updated operational parameters can be adjusted by an amount indicated by the command to reduce power consumption. In some embodiments, the power manger updates one or more operational parameters as described earlier for block 306 without considering the feedback from the reliability monitor. For example, the algorithms and control logic can be preexisting algorithms and logic and they are being reused.

As shown in method 300, in block 312 the one or more operational parameters are further adjusted based on the feedback information from the reliability monitor, but in other embodiments, the power manager updates the one or more operational parameters simultaneously using both the actual usage values and the feedback information from the reliability monitor. For example, using the received command or other information from the reliability monitor, the power manager or other logic determines to further throttle a P-state, further delay scheduling high-performance software applications, further disable one or more functional blocks within the functional unit, and so forth.

If the command or other information from the reliability monitor indicates increasing performance (conditional block 314), then in block 316, one or more updated operational parameters can be adjusted by an amount indicated by the command or other information to increase performance. For example, using the received command or other information from the reliability monitor, the power manager or other logic determines to further boost a P-state, further accelerate scheduling high-performance software applications, further enable one or more functional blocks within the functional unit, and so forth.

Control flow for each of the blocks 312 and 316 moves to block 318 where the adjusted operational parameters are sent from the power manager to the functional unit. The further adjusting in blocks 312 and 316 take into account at least the effects of TDDB, electromigration and age of the functional unit and determination of whether the functional unit is currently exceeding the reliability target.

Figure 4:
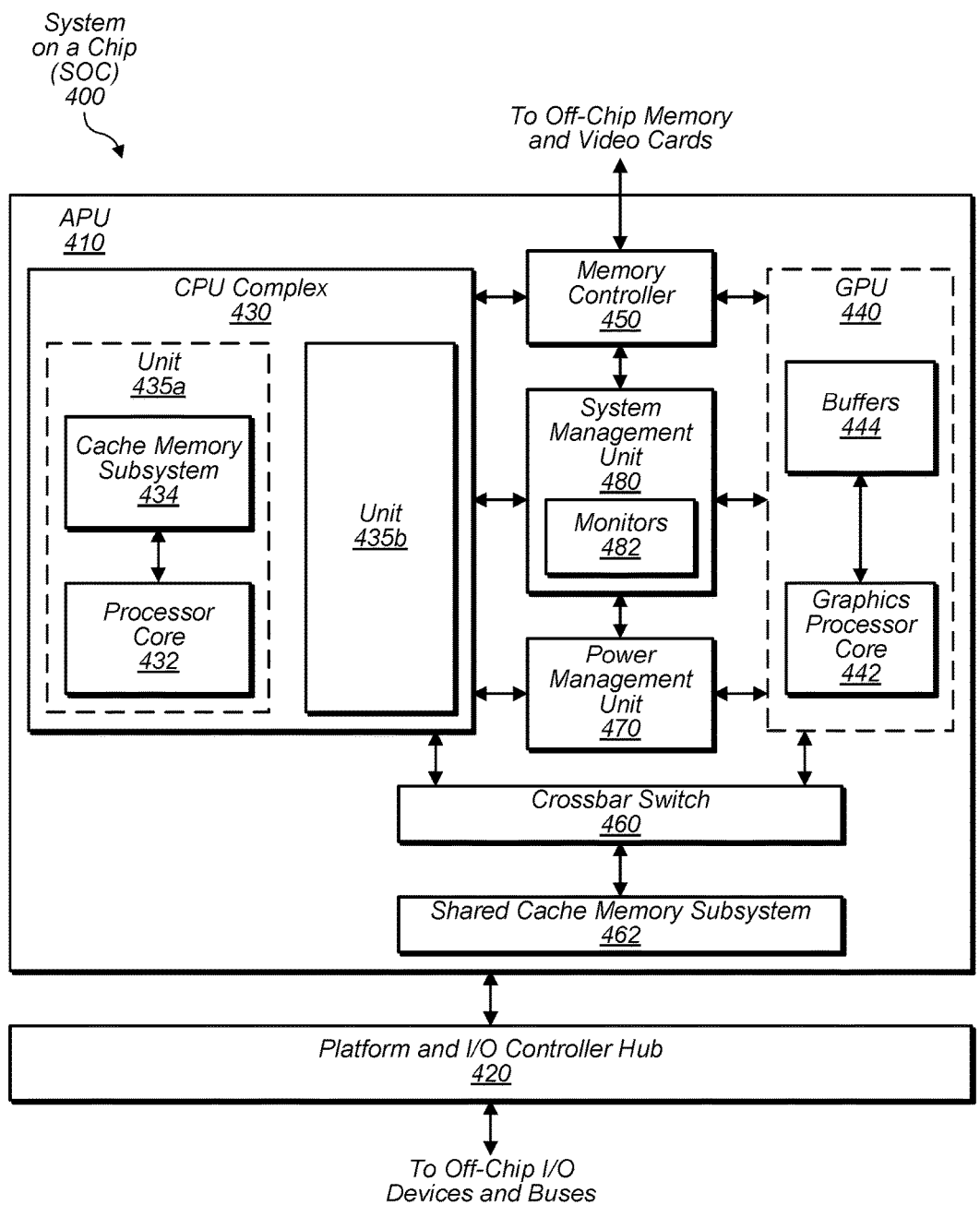
FIG. 4 is a generalized diagram of one embodiment of a system on a chip (SOC).

Turning to FIG. 4, a generalized block diagram of one embodiment of a system-on-a-chip (SOC) 400 is shown. The SOC 400 is an integrated circuit (IC) that includes multiple types of IC designs on a single semiconductor die, wherein each IC design provides a separate functionality. In the illustrated embodiment, the SOC 400 includes both an accelerated processing unit (APU) 410 and a platform and input/output (I/O) controller hub 420 on a single semiconductor die.

In one embodiment, the APU 410 includes a general-purpose central processing unit (CPU) complex 430 and a graphics processing unit (GPU) 440 on a same semiconductor die. Other various processors may be placed in the SOC 400 in addition to or in place of the CPU 430 and the GPU 440. Other examples of on-die processors the SOC 400 uses include at least digital signal processing (DSP) cores, field programmable gate arrays (FPGAs), application specific integrated circuits (ASICs), and so forth.

The APU 410 utilizes a system management unit (SMU) 480 for controlling the operation of the resources on the SOC 400 and synchronizing communication among the resources. The SMU 480 manages power-up sequencing of the various processors on the SOC 400 and control multiple off-chip devices via reset, enable and other signals conveyed through ports in the PICH 420. The SMU 480 also manages communication between the various processors on the multiple buses within the SOC 400.

The SOC 400 includes one or more clock sources, such as phase lock loops (PLLs), which are not shown for ease of illustration. The clock sources provide clock signals for each of the components within the SOC 400. The SMU 480 controls these clock sources. The SMU 480 also controls one or more operational voltages used by circuitry across the SOC 400. For example, the SMU 480 includes a power management unit (not shown).

Additionally, the SMU 480 includes one or more reliability monitors 482. The reliability monitors 482 provide feedback to the power management unit based on factors such as at least the effects of TDDB, electromigration and age. The feedback can be used to determine whether the SOC 400 is currently exceeding a reliability target. In some embodiments, the SMU 480 includes one reliability monitor in the monitors 482 for each voltage/clock domain in the SOC 400.

In some embodiments, the SMU 480 includes a centralized controller for the monitors 482. The centralized controller receives feedback from each of the monitors 482 and determine a final set of commands or other information to send to the power management unit. For example, each one of the monitors 482 can have an associated weight to prioritize its feedback ahead or behind feedback from other monitors. In various embodiments, the weights are assigned by an amount of on-die real estate associated with the corresponding voltage/clock domain. In other embodiments, the weights can be assigned based on the functionality provided by the voltage/clock domain or any other factor.

In some embodiments, a given reliability monitor of the monitors 482 includes the functionality of a centralized controller, rather than the SMU 480 includes a separate centralized controller. In some embodiments, the reliability monitors 482 are dispersed across the SOC 400 near their respective voltage/clock domains. In such embodiments, the reliability monitors 482 provides feedback to the SMU 480, which forwards the feedback to a centralized controller. In other embodiments, the dispersed reliability monitors 482 provide feedback information to a given reliability monitor with the functionality of a centralized controller and the given reliability monitor sends feedback information to the SMU 480 representative of the feedback received from the monitors 482.

The APU 410 includes an integrated memory controller 450 to directly communicate with off-chip memory and video cards. The off-chip memory includes at least dynamic random access memory (DRAM). In addition, the memory controller 450 can be connected to off-chip disk memory through an external memory bus. In one embodiment, the SMU 480 includes integrated channel circuitry to directly link signals from the platform and input/output (I/O) controller hub 420 to the CPU complex 430 and the GPU 440 for data control and access. In some embodiments, the crossbar switch 460 is used for this functionality. In other embodiments, the crossbar switch 460 is not used and the functionality is included in the SMU 480.

The SMU 480 utilizes operational instructions such as firmware and/or other microcode for coordinating signal and bus control. In various embodiments, such operational instructions are stored in a non-volatile memory. Similarly, the reliability monitors 482 uses operational instructions for characterizing actual usage values received from corresponding voltage/clock domains, configuring reliability target values, or the algorithm using both actual usage and target values. As described earlier, a reliability monitor of the monitors 482 includes an algorithm, which can be implemented in firmware or otherwise. In some embodiments, the operational instructions may be updated to modify the algorithm. The algorithm filters the received actual usage values and applies them to one or more equations. The one or more equations calculate contributions of the received usage values to a reliability metric via an accumulating value.

The algorithm in a reliability monitor of the monitors 482 also tracks a target reliability metric that accumulates over time of use. The target metric represents an accumulating typical use case over a lifetime specification. The algorithm uses a PID (proportional, integral and differential) controller to adapt updated operational parameters over time based on actual system usage to maintain overall reliability to meet a target specification.

In some embodiments, the SMU 480 periodically writes one or more of the actual usage values (or corresponding reliability metrics), the expected usage values (or corresponding target metrics), the updated operational parameters to non-volatile memory to preserve the data in the event of the SOC 400 being shut down. For example, the SMU 480 periodically writes the data to off-chip memory through the memory controller 450. The time interval for writing the data can be programmable.

The platform and I/O controller hub (PICH) 420 can interface with different I/O buses according to given protocols. The PICH 420 can perform I/O functions and communicate with devices and software such as peripherals following the Universal Serial Bus (USB) protocol, peripherals and network cards following the Peripheral Component Interconnect Express (PCIe) protocol, the system basic input/output software (BIOS) stored in a read only memory (ROM), interrupt controllers, Serial Advanced Technology Attachment (SATA) devices, network interfaces, a multi-channel high definition audio codec functionality and interface and so forth. The PICH 420 can perform on-die the operations typically performed off-die by a conventional Southbridge chipset.

The CPU complex 430 includes one or more processing units 435a-435b, which includes a processor core 432 and a corresponding cache memory subsystem 434. In some embodiments, the CPU 430 can also include a shared cache memory subsystem 462, which is accessed by each one of the processing units 435a-435b. Each processor core 432 includes circuitry for executing instructions according to a given instruction set. For example, the SPARC® instruction set architecture (ISA) can be selected. Alternatively, the x86, x86-64®, Alpha®, PowerPC®, MIPS®, PA-RISC®, or any other instruction set architecture can be selected.

The GPU 440 can be able to both directly access both local memories 434 and 462 and off-chip memory via the integrated memory controller 450. Such embodiments can lower latency for memory accesses for the GPU 440, which can translate into higher performance. Since cores within each of the CPU 430 and the GPU 440 can access a same memory, the SMU 480 maintains cache coherency for the CPU 430 and the GPU 440. One or more of the memory controller 450 and the SMU 480 can perform address translations for memory accesses.

In various embodiments, the GPU 440 includes one or more graphic processor cores 442 and data storage buffers 444. The graphic processor core performs data-centric operations for at least graphics rendering and three dimensional (3D) graphics applications. The graphics processor core 442 has a highly parallel structure making it more effective than the general-purpose CPU 430 for a range of complex algorithms.

As described earlier, each of the reliability monitors 482 adjust operational parameters sent from the power management unit to the multiple voltage/clock domains across the SOC 400. The further adjusting by the reliability monitors 482 take into account at least the effects of TDDB, electro-migration and age of the SOC 400 and determine whether the SOC 400 is currently exceeding its reliability target.

Figure 5:
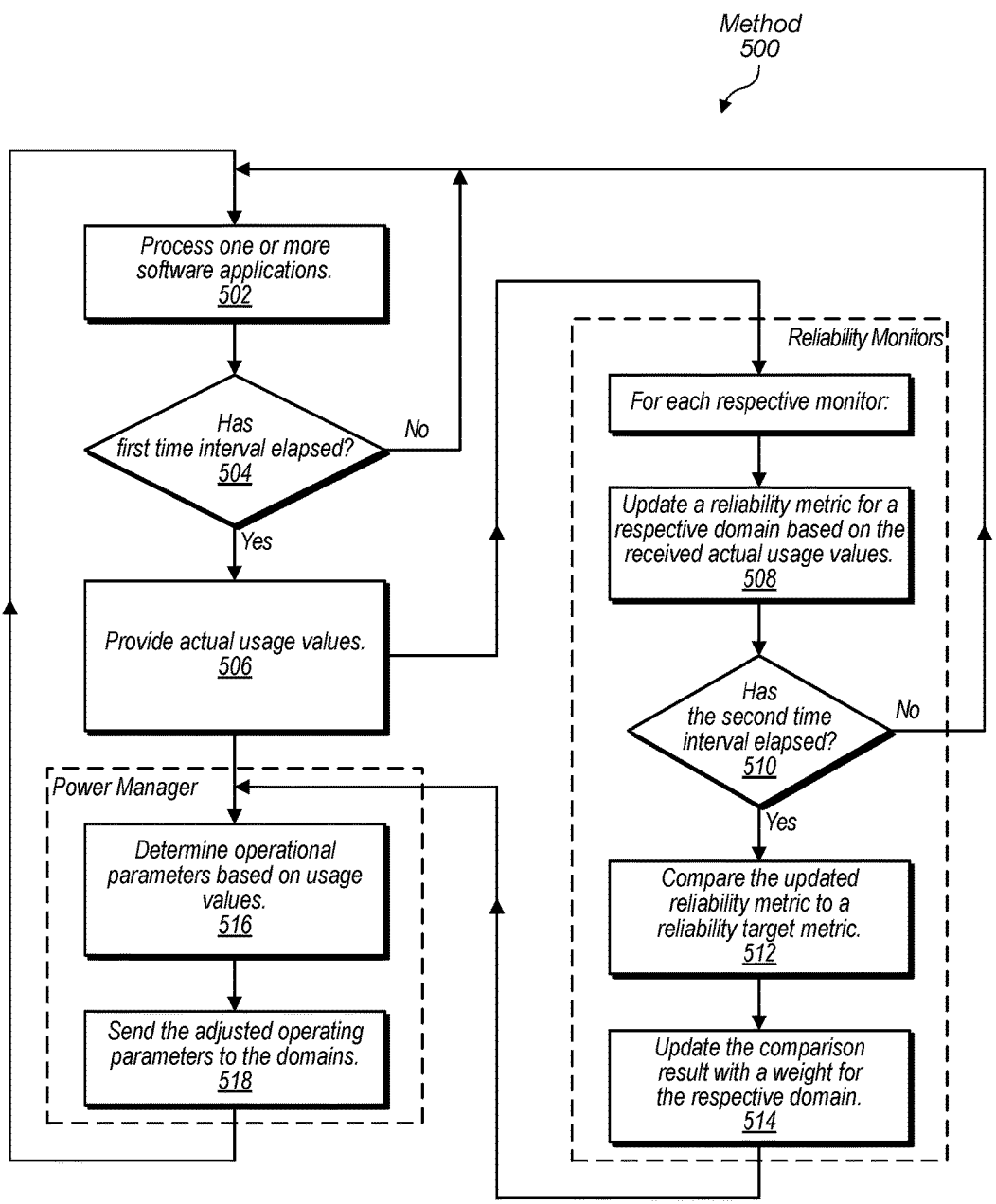
FIG. 5 is a generalized diagram of one embodiment of a method for increasing performance and reliability of a semiconductor chip.

Referring now to FIG. 5, one embodiment of a method 500 for increasing performance and reliability of a semiconductor chip is shown. In block 502, one or more software applications are processed. The software applications are processed on a processor, a processing unit, a CPU complex, a GPU, a SOC, or other. A first time interval can correspond to how often actual usage values of a chip or unit are sent to a corresponding reliability monitor and a power manager. For example, the first time interval can be a millisecond, although other time intervals can be selected and used. In addition, the first time interval can be programmable.

If the first time interval has elapsed (conditional block 504), then in block 506, actual usage values from voltage/clock domains are sent to respective reliability monitors and a power manager. Starting with the reliability monitors, in block 508, a reliability metric for a respective voltage/clock domain is updated based on the received actual usage values. As described earlier, the reliability monitor combines the received actual usage values to generate a single reliability metric. The reliability metric can be maintained as an accumulated value over time based at least upon the actual usage values and the age of the functional units within the voltage/clock domain. By maintaining the reliability metric as an accumulated value, the reliability metric depends on an average of the received actual usage values over time. Similarly, the expected usage values can be combined to generate a single target metric.

The reliability metric and the target metric can be updated every first time interval, such as the example of a millisecond described earlier. In various embodiments, updating operational parameters in the voltage/clock domains occurs less frequently. For example, a second time interval of a day can be used. Other values for the second time interval can be selected and used. Similar to the first time interval, the second time interval can be programmable.

If the second time interval has elapsed (conditional block 510), then in block 512, the updated reliability metric is compared to the updated target metric. The comparison result(s) indicates whether the particular voltage/clock domain is currently overused, underused or on target regarding expected usage based on the reliability target (target lifespan for the chip). The comparison result(s) includes information such as one or more of commands, indications or flags, or computed values used to adjust operational parameters for the voltage/clock domains. The information indicates throttling or boosting P-states, rescheduling tasks, threads or processes of one or more software applications, and enabling or disabling particular functional blocks or functional units in the voltage/clock domains.

In block 514, the comparison result(s) can be updated with a weight for the respective voltage/clock domain. As described earlier, a centralized controller can be used for the multiple reliability monitors and receive feedback from each of the monitors. The centralized controller determines a final set of commands or other information to send to the power manager. For example, each one of the reliability monitors has an associated weight to prioritize its feedback ahead or behind feedback from other monitors. In various embodiments, the weights are assigned by an amount of on-die real estate associated with the corresponding voltage/clock domain. In other embodiments, the weights can be assigned based on the functionality provided by the voltage/clock domain or any other factor. The centralized controller provides information generated from the feedback from the multiple reliability monitors to the power manager.

In block 516, the power manager determines operational parameters for the voltage/clock domains based on the received actual usage values and information from the multiple reliability monitors. As described earlier, the command(s) or other information indicates throttling or boosting P-states, rescheduling tasks, threads or processes of one or more software applications, and enabling or disabling particular functional blocks or functional units in the voltage/clock domains. In some embodiments, the information from the reliability monitors is received less frequently than the information from the voltage/clock domains. For example, the power manager receives information from the voltage/clock domains every millisecond, whereas the power manager receives information from the reliability monitors daily. In block 518, the power manager sends the updated operational parameters and any other directives or commands to the voltage/clock domains.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor chip comprising:
   a functional unit;
   a monitor comprising circuitry configured to:
      monitor an actual usage of the functional unit;
      compare the actual usage of the functional unit to an expected usage of the functional unit, wherein the expected usage is based at least in part on an age of the functional unit; and
      provide information corresponding to said compare;

a power manager comprising circuitry configured to:
update operating parameters of the functional unit to change power consumption for the functional unit responsive to the information; and
send the updated operating parameters to the functional unit;
wherein in response to determining the actual usage is less than the expected usage, the updated operating parameters include maximum values for the operating parameters that are greater than current maximum values for the operating parameters.

2. The semiconductor chip as recited in claim 1, wherein the operating parameters include one or more of an operational voltage and a power-performance state associated with maximum performance.

3. The semiconductor chip as recited in claim 1, wherein in response to determining the actual usage is greater than the expected usage, the updated operating parameters include maximum values for the operating parameters that are less than current maximum values for the operating parameters.

4. The semiconductor chip as recited in claim 1, wherein responsive to a first command, the power manager is configured to update maximum values for the operating parameters.

5. The semiconductor chip as recited in claim 1, wherein in response to determining the actual usage is different than the expected usage, the monitor is further configured to change the expected usage of the functional unit.

6. The semiconductor chip as recited in claim 1, wherein monitoring the actual usage comprises receiving values comprising one or more of an operational voltage and a temperature measurement.

7. The semiconductor chip as recited in claim 6, wherein the monitor is further configured to:
maintain a reliability metric as an accumulated value over time based at least upon the actual usage of the functional unit and the age of the functional unit; and
compare the reliability metric with a reliability target.

8. The semiconductor chip as recited in claim 7, wherein the monitor is further configured to store the reliability metric to non-volatile memory responsive to detecting a given time interval has elapsed.

9. The semiconductor chip as recited in claim 1, wherein the semiconductor chip further comprises:
a plurality of voltage/clock domains, each operating with operating parameters; and
a plurality of monitors, each configured to:
receive actual usage values from a respective one of the plurality of voltage/clock domains; and
compare the actual usage values to expected usage values of the voltage/clock domains.

10. A method comprising:
operating a functional unit of a processor;
comparing, by a monitor comprising circuitry, an actual usage of the functional unit to an expected usage of the functional unit, wherein the expected usage is based at least in part on an age of the functional unit; and
updating, by a power manager comprising circuitry, operating parameters of the functional unit to change power consumption for the functional unit, in response to determining the actual usage is different from the expected usage;
wherein in response to determining the actual usage is less than the expected usage, the updating comprises changing maximum values of the operating parameters to be greater than current maximum values of the operating parameters such that the functional unit operates at a higher performance level.

11. The method as recited in claim 10, wherein the operating parameters include one or more of an operational voltage and a power-performance state.

12. The method as recited in claim 10, wherein in response to determining the received actual usage values are greater than the expected usage values, the updating comprises changing maximum values of the operating parameters to be less than current maximum values of the operating parameters.

13. The method as recited in claim 10, wherein in response to determining the actual usage is different than the expected usage, the method further comprises changing the expected usage of the functional unit.

14. The method as recited in claim 10, wherein the actual usage values comprise one or more of an operational voltage and an on-die temperature measurement.

15. An on-die reliability monitor comprising:
a first interface comprising circuitry configured to receive information indicative of an actual usage of a functional unit;
control logic comprising circuitry configured to:
compare the actual usage of the functional unit to an expected usage of the functional unit; and
generate information usable to change operating parameters of the functional unit, in response to determining the actual usage is different than the expected usage; and
a second interface comprising circuitry configured to convey the information to a power manager;
wherein in response to determining the received actual usage is less than the expected usage, the information indicates an increase in maximum values for the operating parameters.

16. The reliability monitor as recited in claim 15, wherein in response to determining the received actual usage is less than the expected usage, the information indicates an increase in maximum values for the operating parameters.

17. The reliability monitor as recited in claim 15, wherein in response to determining the received actual usage is greater than the expected usage, the information indicates a decrease in maximum values for the operating parameters.

18. The reliability monitor as recited in claim 15, wherein the information indicative of the actual usage values comprise one or more of an operational voltage and an on-die temperature measurement.

19. A system comprising:
a functional unit;
a system management unit including operational instructions comprising an algorithm for adapting operating parameters over time;
a monitor comprising circuitry configured to:
monitor an actual usage of the functional unit;
compare the actual usage of the functional unit to an expected usage of the functional unit, wherein the expected usage is based at least in part on an age of the functional unit; and
provide information corresponding to said compare;
a power manager comprising circuitry configured to:
update operating parameters of the functional unit to change power consumption for the functional unit, responsive to the information and the operational instructions; and
send the updated operating parameters to the functional unit;

wherein in response to determining the actual usage is less than the expected usage, the updated operating parameters include maximum values for the operating parameters that are greater than current maximum values for the operating parameters.

20. The system as recited in claim 19, wherein in the operational instructions comprise firmware.

21. The system as recited in claim 19, wherein the operational instructions may be updated.

22. The system as recited in claim 19, wherein the operational instructions reside in non-volatile memory.

23. The system as recited in claim 19, wherein the operating parameters include one or more of an operational voltage and a power-performance state associated with maximum performance.

24. The system as recited in claim 19, wherein in response to determining the actual usage is greater than the expected usage, the updated operating parameters include maximum values for the operating parameters that are less than current maximum values for the operating parameters.

* * * * *